United States Patent
Kim et al.

(10) Patent No.: US 10,065,161 B2
(45) Date of Patent: Sep. 4, 2018

(54) RESIN DISPENSING APPARATUS

(71) Applicant: Samsung Electronics Co., Ltd., Suwon-si (KR)

(72) Inventors: Joon Young Kim, Suwon-si (KR); Young Kyung Kim, Suwon-si (KR)

(73) Assignee: SAMSUNG ELECTRONICS CO., LTD. (KR)

(*) Notice: Subject to any disclaimer, the term of this patent is extended or adjusted under 35 U.S.C. 154(b) by 168 days.

(21) Appl. No.: 15/353,113

(22) Filed: Nov. 16, 2016

(65) Prior Publication Data
US 2017/0209842 A1 Jul. 27, 2017

(30) Foreign Application Priority Data
Jan. 25, 2016 (KR) .................. 10-2016-0008505

(51) Int. Cl.
*B01F 15/02* (2006.01)
*B01F 9/00* (2006.01)
(Continued)

(52) U.S. Cl.
CPC .......... *B01F 15/0278* (2013.01); *B01F 7/086* (2013.01); *B01F 9/00* (2013.01);
(Continued)

(58) Field of Classification Search
CPC .. B01F 15/0278; B01F 9/0007; B01F 9/0009; B01F 9/00; B01F 9/0003; B01F 9/16; B01F 7/086; B01F 2009/0063; B01F 2009/0065; B01F 2009/009; B01F 2215/0049; H01L 2933/0041; H01L 2933/005; H01L 33/507; H01L 33/56; B05C 11/10; B05C 11/1047;
(Continued)

(56) References Cited

U.S. PATENT DOCUMENTS 3,544,522 A * 12/1970 Wolf-Diether ........ B01F 9/0007
159/25.1
3,588,052 A * 6/1971 Scholtz ................. B01F 9/0007
366/228
(Continued)

FOREIGN PATENT DOCUMENTS

CN 103639092 3/2014
JP 2013168528 A * 8/2013
(Continued)

OTHER PUBLICATIONS

Machine Translation of JP 2013168528 Aug. 2013, Translated on 06:56:46 JST Jun. 22, 2018, 37 pages.*

*Primary Examiner* — Tony G Soohoo
(74) *Attorney, Agent, or Firm* — Onello & Mello, LLP (57) ABSTRACT

A resin dispensing apparatus includes a supply unit including a syringe having an internal space configured to hold a phosphor-containing resin. An agitator is disposed in the internal space. The supply unit is configured to rotate at least one of the syringe and the agitator to prevent settling of phosphor contained in the phosphor-containing resin. A discharge unit includes a cylinder having a discharge nozzle through which the phosphor-containing resin, received through a connecting pipe connected to the syringe, is discharged. A piston provides pressure to discharge the phosphor-containing resin through the discharge nozzle inside the cylinder.

20 Claims, 9 Drawing Sheets

(51) Int. Cl.
  *B01F 9/16* (2006.01)
  *H01L 33/50* (2010.01)
  *B05C 5/02* (2006.01)
  *B05C 11/10* (2006.01)
  *B01F 7/08* (2006.01)
  *H01L 33/56* (2010.01)
  *F21K 9/278* (2016.01)
  *F21K 9/68* (2016.01)
  *F21K 9/238* (2016.01)
  *F21V 29/74* (2015.01)
  *F21Y 115/10* (2016.01)
  *F21Y 103/10* (2016.01)

(52) U.S. Cl.
  CPC .......... *B01F 9/0003* (2013.01); *B01F 9/0007* (2013.01); *B01F 9/0009* (2013.01); *B01F 9/16* (2013.01); *B05C 5/0208* (2013.01); *B05C 5/0225* (2013.01); *B05C 11/10* (2013.01); *H01L 33/507* (2013.01); *H01L 33/56* (2013.01); *B01F 2009/009* (2013.01); *B01F 2009/0063* (2013.01); *B01F 2009/0065* (2013.01); *B01F 2215/0049* (2013.01); *B05C 5/0212* (2013.01); *B05C 11/1047* (2013.01); *F21K 9/238* (2016.08); *F21K 9/278* (2016.08); *F21K 9/68* (2016.08); *F21V 29/74* (2015.01); *F21Y 2103/10* (2016.08); *F21Y 2115/10* (2016.08); *H01L 2933/005* (2013.01); *H01L 2933/0041* (2013.01)

(58) Field of Classification Search
  CPC ... B05C 5/0208; B05C 5/0212; B05C 5/0225; F21Y 2103/10; F21Y 2115/10; F21V 29/74; F21K 9/238; F21K 9/278; F21K 9/68
  See application file for complete search history.

(56) References Cited

U.S. PATENT DOCUMENTS

| | | | |
|---|---|---|---|
| 4,004,782 A * | 1/1977 | Jeppsen | B01F 9/0007 366/138 |
| 4,386,855 A * | 6/1983 | Neal, Jr. | B01F 5/0659 366/138 |
| 4,688,702 A * | 8/1987 | Yeames | B05C 17/00553 222/135 |
| 5,092,753 A * | 3/1992 | Kumamura | B29C 45/5008 264/40.4 |
| 5,350,600 A * | 9/1994 | Kubota | B05C 5/0216 118/301 |
| 5,538,343 A * | 7/1996 | Tynan | B01D 19/0052 366/149 |
| 6,173,864 B1 | 1/2001 | Reighard et al. | |
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,736,291 B1 * | 5/2004 | Mimura | B05C 11/00 222/129 |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,966,894 B1 * | 11/2005 | Urich | A61M 5/14546 600/432 |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,511,411 B2 | 3/2009 | Maruta et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,832,920 B2 * | 11/2010 | Wood | B01F 3/04531 366/170.3 |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,092,075 B2 * | 1/2012 | Ishii | B01D 19/0052 366/139 |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,534,906 B2 | 9/2013 | Harada | |
| 8,536,604 B2 | 9/2013 | Kwak et al. | |
| 8,735,931 B2 | 5/2014 | Han et al. | |
| 8,766,295 B2 | 7/2014 | Kim | |
| 9,126,157 B2 | 9/2015 | Itoh | |
| 2002/0172091 A1 * | 11/2002 | Hatakeyama | A47J 19/027 366/144 |
| 2003/0117888 A1 * | 6/2003 | Reilly | A61M 5/14566 366/162.3 |
| 2004/0013034 A1 * | 1/2004 | Metcalfe, III | B01F 7/008 366/230 |
| 2005/0177109 A1 * | 8/2005 | Azzolini | A61M 5/1456 604/151 |
| 2005/0226636 A1 * | 10/2005 | Hiramatsu | H01S 5/02228 398/182 |
| 2005/0281133 A1 * | 12/2005 | Surjaatmadja | B01F 9/0007 366/168.1 |
| 2006/0086592 A1 * | 4/2006 | Olds | B65G 33/20 198/658 |
| 2006/0105022 A1 * | 5/2006 | Yokokawa | A61K 8/042 424/439 |
| 2015/0140700 A1 * | 5/2015 | Sato | C09K 11/02 438/27 |
| 2016/0002526 A1 * | 1/2016 | Sato | C09K 11/02 257/98 |
| 2016/0101541 A1 * | 4/2016 | Collins | B29C 47/522 524/1 |
| 2017/0209842 A1 * | 7/2017 | Kim | H01L 33/56 |

FOREIGN PATENT DOCUMENTS

| | | | |
|---|---|---|---|
| JP | 2014110324 A * | 6/2014 | |
| JP | 5712949 | 5/2015 | |
| KR | 1020140063139 | 5/2014 | |
| KR | 1020140109742 | 9/2014 | |

* cited by examiner

RESIN DISPENSING APPARATUS

CROSS-REFERENCE TO RELATED APPLICATION

This application claims priority under 35 U.S.C. § 119 from Korean Patent Application No. 10-2016-0008505, filed on Jan. 25, 2016, the disclosure of which is hereby incorporated by reference in its entirety.

BACKGROUND

The present inventive concept relates to a resin dispensing apparatus. An existing resin dispensing apparatus coats a light emitting device using a method in which a syringe, filled with a fixed amount of a phosphor-containing degassed resin in a liquid phase, is connected to a dispenser. A phosphor-containing resin is supplied to the dispenser, which discharges a fixed amount of the phosphor-containing resin.

Over time, the syringe is filled with the phosphor-containing resin. Problematically, a phosphor contained in the phosphor-containing resin settles in a lower part of the syringe. Consequently, the settling of the phosphor results in a non-uniform distribution of the phosphor throughout the phosphor-containing resin, which results in an increased difference of the color coordinates of light emitted by light emitting device packages manufactured together.

SUMMARY

An aspect of the present inventive concept may provide a scheme of preventing phosphor settling from occurring in a phosphor-containing resin with which a syringe is filled.

In one aspect, the present inventive concepts are directed to a resin dispensing apparatus comprising a supply unit including a syringe having an internal space configured to hold a phosphor-containing resin. An agitator is disposed in the internal space. The supply unit is configured to rotate the syringe to prevent settling of phosphor contained in the phosphor-containing resin. A discharge unit includes a cylinder having a discharge nozzle through which the phosphor-containing resin, received through a connecting pipe connected to the syringe, is discharged. A piston provides pressure to discharge the phosphor-containing resin inside the cylinder from the discharge nozzle.

In another aspect, the present inventive concepts are directed to a resin dispensing apparatus comprising a supply unit including a syringe having an internal space configured to hold a phosphor-containing resin. An agitator is disposed in the internal space. The supply unit is configured to rotate the agitator to prevent settling of phosphor contained in the phosphor-containing resin. A discharge unit includes a cylinder having a discharge nozzle through which the phosphor-containing resin, received through a connecting pipe connected to the syringe, is discharged. A piston provides pressure to discharge the phosphor-containing resin inside the cylinder through the discharge nozzle.

In another aspect, the present inventive concepts are directed to a resin dispensing apparatus comprising a supply unit including a syringe configured to hold a phosphor-containing resin. An agitator is inside the syringe disposed on a collinear axis of the syringe. The syringe is inclined at an angle to a surface having a dispensing object thereon. A discharge unit is coupled to the supply unit by a connecting pipe configured to transport the phosphor-containing resin from the syringe to the discharge unit. The discharge unit has a piston configured to transfer the phosphor-containing resin from the discharge unit to the dispensing object. A controller is configured to rotate at least one of the syringe and the agitator, and to move the piston to transfer the discharged resin to the dispensing object.

BRIEF DESCRIPTION OF THE DRAWINGS

These and/or other aspects and advantages of the present general inventive concepts will become apparent and more readily appreciated from the following description of the embodiments, taken in conjunction with the accompanying drawings of which.

DETAILED DESCRIPTION

Reference will now be made in detail to the embodiments of the present general inventive concepts, examples of which are illustrated in the accompanying drawings, wherein like reference numerals refer to the like elements throughout. The embodiments are described below in order to explain the present general inventive concepts by referring to the figures.

Figure 1:
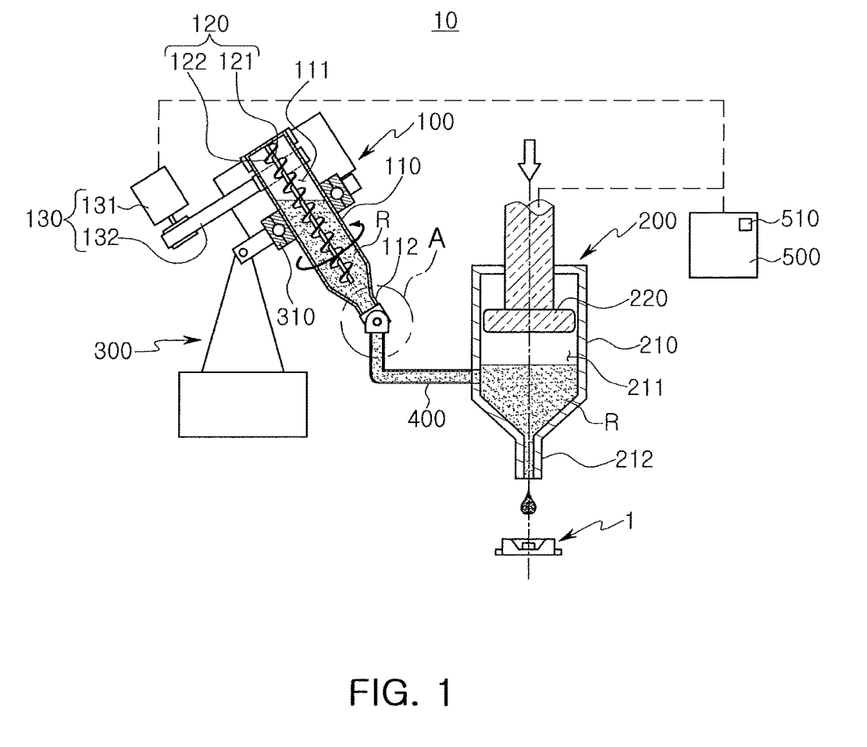
FIG. 1 is a cross-sectional view of a resin dispensing apparatus according to an example embodiment of the present inventive concept.

With reference to FIG. 1, an example embodiment of a resin dispensing apparatus 10 may include a supply unit 100 supplying a phosphor-containing resin R, and a discharge unit 200 discharging the phosphor-containing resin R. The resin dispensing apparatus 10 may further include a frame 300 supporting the supply unit 100. The supply unit 100 may supply the phosphor-containing resin R to the discharge unit 200. The supply unit 100 may include a syringe 110 having an internal space 111 and an agitator 120 disposed in the internal space 111.

The syringe 110 may have a substantially cylindrical structure for easy rotation thereof. The syringe 110 may have a nozzle 112 disposed in a lower portion of the syringe 110. The syringe 110 may discharge the phosphor-containing resin R, with which the internal space 111 is filled, to supply the phosphor-containing resin R to the discharge unit 200.

Supplementary amounts of the phosphor-containing resin R may be provided to the syringe 110 through an upper portion thereof as required.

The agitator 120 may be disposed in the internal space 111 of the syringe 110 through the upper portion of the syringe 110. The agitator 120 may include a shaft 121 extended in a longitudinal direction of the syringe 110, and a blade 122 protruding from an outer circumferential surface of the shaft 121 in the internal space 111. The blade 122 may have a spiral screw structure surrounding the outer circumferential surface of the shaft 121.

According to the example embodiment, the supply unit 100 may have a structure in which the syringe 110 rotates to prevent phosphor from settling in the phosphor-containing resin R. For example, the phosphor-containing resin R may have a form of a liquid in which a silicone resin or an epoxy resin is mixed with at least one type of phosphor.

Supplementary amounts of the phosphor-containing resin R are supplied in liquid inside the syringe 110, whereby a phosphor contained in a resin settles to a lower portion of the syringe 110 with the passage of time. When such phosphor settling occurs over time, a phosphor content in the phosphor-containing resin R supplied to the discharge unit 200 may not be uniform and a difference in uniformity may occur. This may cause a problem of increased differences in color coordinates of light emitted by light emitting device packages manufactured with the resin. Accordingly, the syringe 110 is rotated, to prevent the phosphor from settling, continuously mixing the phosphor inside the phosphor-containing resin R.

The syringe 110 may be connected to a driving unit 130. In one example, the driving unit 130 may include a driving motor 131. A rotational driving force, generated by the driving motor 131, is transferred to the syringe 110 through a chain 132. In one example, the syringe 110 is coupled to the chain 132 with a sprocket attached to the syringe. In another example embodiment, the driving unit 130 is coupled to (and imparts a rotational driving force to) the syringe with a belt driving mechanism.

The example embodiment 10 illustrates that the syringe 110 is connected to the driving motor 131 by the chain 132, but is not necessarily limited thereto. For example, the syringe 110 may be connected to the driving motor 131 through a gear engagement or a belt drive.

The supply unit 100 may be fastened to a frame 300 to facilitate transport. The supply unit 100 may be fastened to the frame 300 and disposed at a predetermined angle of inclination. In other words, the supply unit 100 is not disposed vertically or horizontally, but rather at an incline with respect to a surface (hereinafter "floor") that the frame rests upon. In another embodiment, the syringe is inclined with respect to a surface upon which the dispensing object 1 rests. As the state of being slantedly inclined is maintained, phosphor settling may be more effectively prevented.

Figure 2:
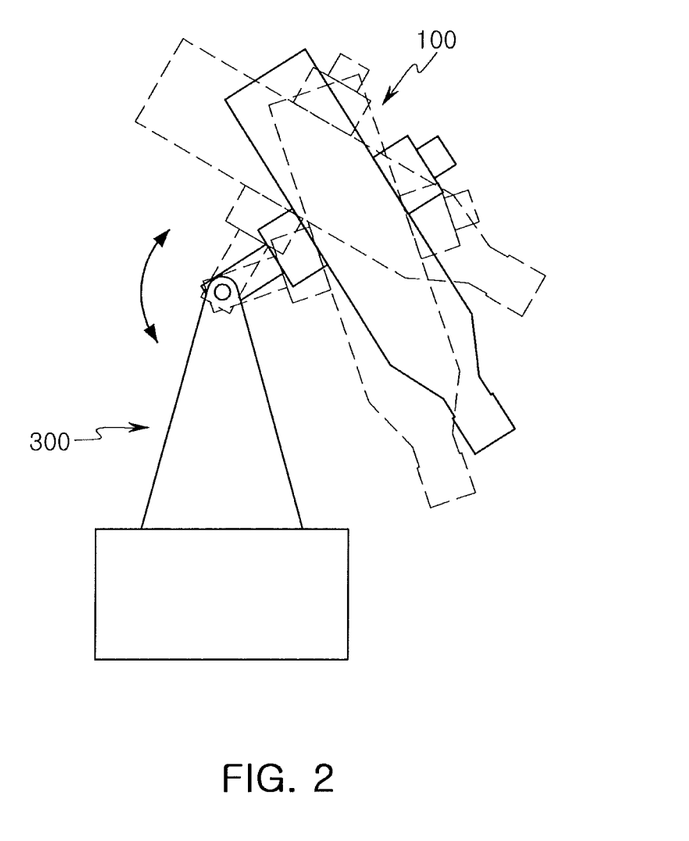
FIG. 2 is an elevation view of a state in which a supply unit is mounted on a frame in the resin dispensing apparatus of FIG. 1.

As illustrated in FIG. 2, the frame 300 may adjust a degree of inclination of the supply unit 100 with various angles with respect to the floor. For example, an inclination of the supply unit 100 may be adjusted according to one or more of the properties of a phosphor-containing resin R, a phosphor content, or a reduction in an amount of a phosphor-containing resin R to be supplied to the discharge unit 200. The optimal angle of inclination provides sufficient vertical gravitational force (orthogonal to the floor) to dispense the resin R from the supply unit 100, while providing sufficient horizontal force (parallel to the floor) to force the resin R against a sidewall of the syringe 110 to enable the agitation of the resin R when at least one of the syringe 110 or the agitator 120 is rotated.

The syringe 110 may be coupled to the frame 300 to enable rotation. For example, to rotate the syringe 110, a bearing 310 may be interposed between the syringe 110 and the frame 300 to allow the syringe 110 to freely rotate while being supported by the frame.

In one embodiment, the frame 300 may be fastened to the agitator 120, while supporting the agitator 120. In this case, unlike the syringe 110 of FIG. 1, the agitator 120 may not be rotated and may be maintained in a fixed state.

As described above, the phosphor-containing resin R, with which the syringe 110 is filled, may be continuously stirred and mixed to avoid phosphor settling by using a structure which rotates the syringe 110 and which includes the agitator 120 disposed inside the syringe 110.

Figure 3:
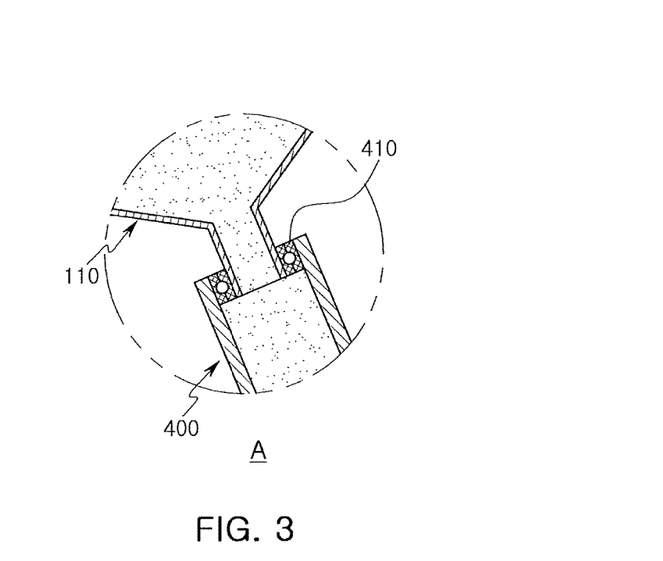
FIG. 3 is an enlarged cross-sectional view of portion 'A' of FIG. 1.

With reference to FIG. 1 and FIG. 3, the syringe 110 may be connected to the discharge unit 200 by a connecting pipe 400. The phosphor-containing resin R may be supplied to the discharge unit 200 through the connecting pipe 400. The syringe 110 may be fastened to the connecting pipe 400 by a hinge, but is not limited thereto. For example, an end portion of the connecting pipe 400 may have a flexible corrugated pipe structure, and the nozzle 112 of the syringe 110 may also be fastened to the connecting pipe 400 in a structure inserted into the end portion of the connecting pipe 400. As illustrated in FIG. 3, a bearing 410 may be located where the syringe 110 and the connecting pipe 400 join each other and may be interposed between surfaces thereof to rotate the syringe 110 in a state in which the syringe 110 is connected to the connecting pipe 400. In another embodiment, the syringe 110 is coupled to the connecting pipe 400 by a low friction sleeve (e.g. made of Teflon).

The discharge unit 200 may receive the phosphor-containing resin R from the supply unit 100 and discharge the phosphor-containing resin R to a dispensing object 1, whereby the dispensing object 1 may be dispensed with the phosphor-containing resin R. The discharge unit 200 may include a cylinder 210 connected to the connecting pipe 400, and a piston 220 disposed inside the cylinder 210.

The cylinder 210 may have an internal space 211 having a predetermined volume, and store the phosphor-containing resin R supplied through the connecting pipe 400. The cylinder 210 may have a discharge nozzle 212 discharging the phosphor-containing resin R. The piston 220 may be disposed in the internal space 211 of the cylinder 210 and provide pressure to discharge the phosphor-containing resin R externally through the discharge nozzle 212. The piston 220 adjusts an applied pressure to the resin R, thereby adjusting a discharge amount of the phosphor-containing resin R. In another embodiment, the piston 220 alternatively applies a suction to the cylinder to draw the resin R into the internal space 211 and a pressure to dispense the resin R through the discharge nozzle 212.

The discharge unit 200 may be disposed directly above a dispensing object 1. For example, the discharge unit 200 may be disposed collinear with a central axis of the dispensing object 1, and to be substantially perpendicular thereto. In various examples, the dispensing object 1 may be a light emitting device or a light emitting device package in which a light emitting device is mounted. The light emitting device may be encapsulated by the phosphor-containing resin R discharged from the discharge unit 200.

The supply unit 100 and the discharge unit 200 may be connected to a control unit 500. The control unit 500 may control operations of the supply unit 100 and the discharge unit 200 in an automated manner. In one example, the control unit controls the operations of the supply unit 100, and the discharge unit by receiving wired or wireless instructions from a user. In another example, the control unit includes preprogrammed instructions in firmware or hardware. In another example, the control unit also controls the operation of the driving unit.

The control unit 500 may have a notifying unit 510 capable of notifying a user when the supply unit 100 and the discharge unit 200 are abnormally operated or some other fault has occurred.

Figure 4:
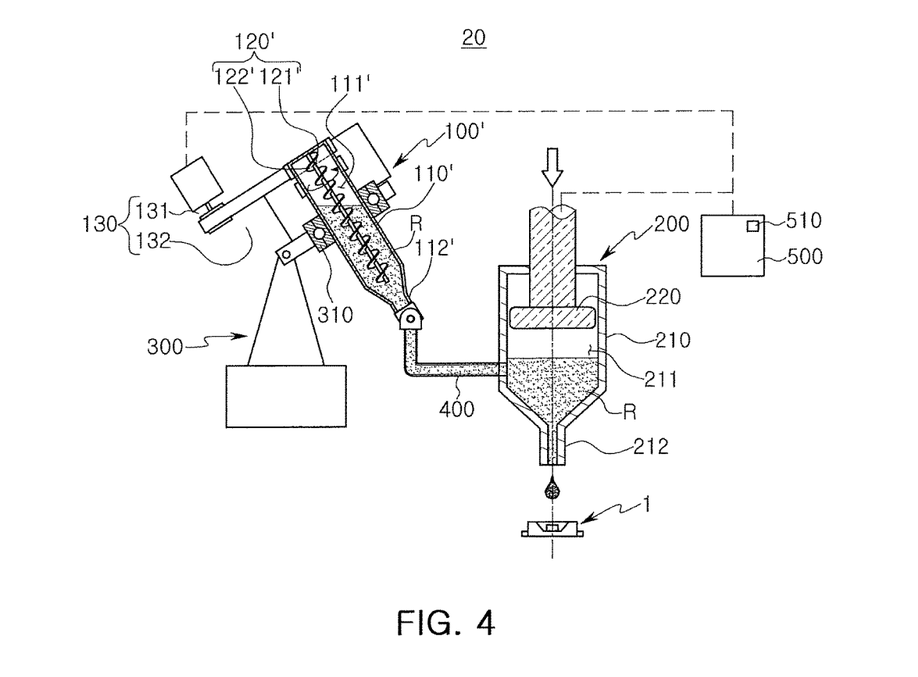
FIG. 4 is a cross-sectional view of a resin dispensing apparatus according to an example embodiment.

With reference to FIG. 4, a resin dispensing apparatus 20, according to an example embodiment, may include a supply unit 100' supplying a phosphor-containing resin R and a discharge unit 200 discharging the phosphor-containing resin R. The resin dispensing apparatus 20 may further include a frame 300 supporting the supply unit 100', a driving unit 130, and a control unit 500.

A configuration of the resin dispensing apparatus 20 according to the example embodiment illustrated in FIG. 4 is substantially similar as a basic configuration of the resin dispensing apparatus 10 illustrated in FIG. 1 to FIG. 3. However, the embodiment 20 of FIG. 4 rotates the agitator 120 rather than rotating the syringe 110, as shown in embodiment 10 of FIG. 1. Overlapping descriptions of common elements between the embodiment 10 and the embodiment 20 will be omitted or brevity, with difference described hereinafter. In one embodiment, the agitator 120 is configured to rotate in one direction to facilitate transfer of the resin R to the connecting pipe (e.g. to force the resin R towards the nozzle 112). In another embodiment, the agitator 120 is configured to rotate in another direction to facilitate agitation of the resin R by forcing the resin R away from the nozzle 112 (e.g. to oppose the gravitational force pulling the resin R towards the nozzle 112. In another embodiment, the agitator 120 selectively alternates rotational directions under control of the control unit 500.

With reference to FIG. 4, the supply unit 100' may include a syringe 110' having an internal space 111', accommodating the phosphor-containing resin R therein and an agitator 120' disposed in the internal space 111'. The supply unit 100' is fastened to the frame 300 and then supported thereby.

The syringe 110' may have a substantially cylindrical structure. The syringe 110' may have a nozzle 112' discharging the phosphor-containing resin R in a lower portion thereof to supply the phosphor-containing resin R with which the internal space 111' is filled to the discharge unit 200. The agitator 120' may be disposed in the internal space 111' of the syringe 110' through an upper portion of the syringe 110'. The agitator 120' may include a shaft 121' extended in a longitudinal direction of the syringe 110', and a blade 122' protruding from an outer circumferential surface of the shaft 121' in the internal space 111'. In another embodiment, the syringe 110' has a substantially cylindrical interior, wherein the agitator 120' rotates, with a non-cylindrical exterior.

The supply unit 100' according to the example embodiment may have a structure for rotation of the agitator 120' to prevent phosphor settlement from occurring in the phosphor-containing resin R. For example, as the agitator 120' rotates, a phosphor in the phosphor-containing resin R does not settle and is continuously agitated to prevent the occurrence of phosphor settling.

The agitator 120' may be connected to the driving unit 130. The driving unit 130, for example, may include a driving motor 131. For example, a driving force generated in the driving motor 131 may be transferred to the agitator 120' through a chain 132 transmitting power, and the agitator 120' may be fastened to the chain 132 and rotated.

The example embodiment illustrates that the agitator 120' is connected to the driving motor 131 through the chain 132 by way of example, but is not limited thereto. For example, the agitator 120' may be connected to the driving motor 131 through a gear engagement, or a belt driven engagement. In addition, the syringe 110' is fastened to the frame 300, by which the syringe 110' may be not rotated but rather disposed in a fixed state.

The supply unit 100' may supply the phosphor-containing resin R to the discharge unit 200 through a connecting pipe 400. The discharge unit 200 may include a cylinder 210 storing the phosphor-containing resin R, and a piston 220 discharging the phosphor-containing resin R externally through a discharge nozzle 212 of the cylinder 210.

Figure 5A:
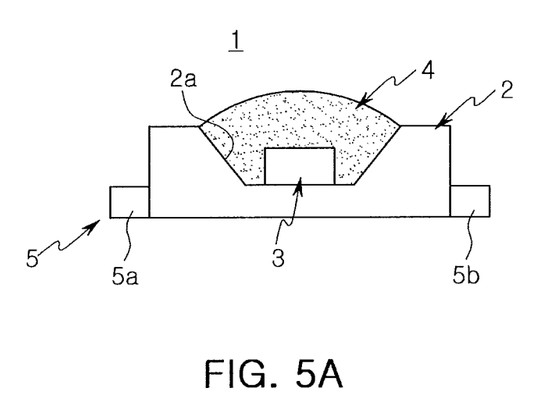
FIG. 5A and FIG. 5B are cross-sectional views of example embodiments of light emitting device packages, which are dispensing objects.
Figure 5B:
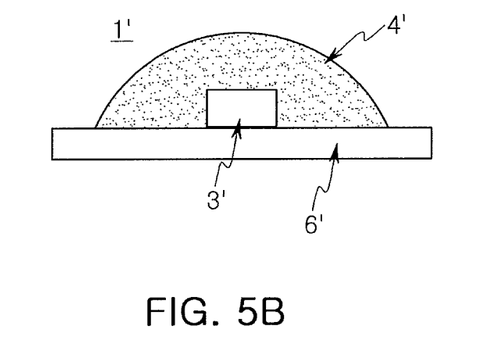

FIG. 5A and FIG. 5B are cross-sectional views of example embodiments of light emitting device packages, which are dispensing objects. As previously described, the dispensing object may be a light emitting device or a light emitting device package on which a light emitting device is mounted. The light emitting device may be encapsulated by a phosphor-containing resin R discharged through the resin dispensing apparatus. In the following description, the dispensing object is described as a light emitting device package 1.

With reference to FIG. 5A, a light emitting device package 1 according to an example embodiment, may have a package structure in which a light emitting device 3 is mounted in a package body 2 having a reflector cup. In addition, the light emitting device 3 may be covered by an encapsulation portion 4 including a resin containing a phosphor.

The package body 2 may correspond to a base member on which the light emitting device 3 is mounted and is supported thereby, and may be formed using a white molding compound having relatively high light reflectivity. Thus, the package body 2 has an effect of increasing an amount of light emitted externally by reflecting light emitted from the light emitting device 3.

The white molding compound may include thermosetting resin having relatively high heat resistance or silicone resin. Alternatively, at least one of a white pigment, a filler, a curing agent, a releasing agent, an antioxidant, or an adhesion improving agent may be added to thermoplastic resin. In addition, the white molding compound may include at least one of FR-4, CEM-3, an epoxy material, a ceramic material. The white molding compound may also include a metallic material.

The package body 2 may include a lead frame 5 for an electrical connection to an external power supply. For example, the lead frame 5 may be fanned of a material having excellent electrical conductivity such as a metallic material including Aluminum (Al), or Copper (Cu).

At least one pair of lead frames 5 may be disposed in a structure separated from each other and opposing each other for electrical insulation therebetween. For example, the lead frame 5 may include a first lead frame 5a having a first polarity and a second lead frame 5b having a second polarity different from the first polarity. The first polarity and the second polarity may be an anode and a cathode (or vice versa), respectively. In addition, the first lead frame 5a and the second lead frame 5b may be separated from each other and electrically insulated by the package body 2.

Bottom surfaces of the first and second lead frames 5a and 5b may be exposed externally through a bottom surface of the package body 2. Accordingly, heat generated by the light emitting device 3 is emitted externally to improve heat radiation efficiency. In other words, heat generated by photonic emission of the light emitting device 3 is partially removed by the lead frame 5 acting as a heat sink.

The package body 2 may have a reflector cup 2a recessed to a predetermined depth on an upper surface thereof. The reflector cup 2a may have a cup structure of which an inner lateral surface is inclined toward a bottom surface of the package body 2 in a tapered form. In addition, an end surface of the reflector cup 2a exposed upwardly from the package body 2 may be defined as a light emitting surface of the light emitting device package 1. The first and second lead frames 5a and 5b may be partially exposed to a bottom surface of the reflector cup 2a. The light emitting device 3 may be electrically connected to the first and second lead frames 5a and 5b.

The light emitting device 3 may be an optoelectronic device generating light having a predetermined wavelength by driving power applied from an external source through the lead frame 5. For example, the light emitting device 3 may include a semiconductor light-emitting diode (LED) chip including a first conductivity type semiconductor layer, a second conductivity type semiconductor layer, and an active layer interposed therebetween. The light emitting device 3 may emit blue light, green light, or red light according to a combination with an included material or phosphor, and may also emit white light, or ultraviolet light, but is not limited thereto. A specific configuration and structure of the light emitting device 3 will be described later.

The encapsulation portion 4 may cover the light emitting device 3. The encapsulation portion 4 may be formed by curing the phosphor-containing resin R. The encapsulation portion 4 may be formed of a transparent or semi-transparent material to externally emit light generated by the light emitting device 3. For example, the encapsulation portion 4 may be formed of a resin such as silicone, or epoxy.

The example embodiment illustrates that the encapsulation portion 4 has a structure of a lens in a form of a convexed dome, but is not limited thereto. The encapsulation portion 4 may also be formed to have a flat form corresponding to an upper surface of the package body 2. In addition, a separate lens may be additionally attached to the upper surface of the package body 2.

FIG. 5B illustrates a modification embodiment 1' of the light emitting device package 1. As illustrated in FIG. 5B, a light emitting device package 1', may include a chip on board (COB) structure in which a light emitting device 3' is mounted on a substrate 6'. In addition, the light emitting device 3' may be covered by an encapsulation 4' formed of a resin containing a phosphor.

With reference to FIG. 5A and FIG. 5B, in one example, the encapsulation portion 4 includes at least one type of phosphor excited by light generated by the light emitting device 3. The emitting light will have a wavelength dependent upon the material composition of the encapsulation portion 4 (or 4'), so that light having various colors as well as white light may be emitted through control thereof.

For example, when the light emitting device 3 is an LED chip emitting blue light; yellow, green, red and/or orange phosphors may be combined therewith to allow white light to be emitted. In addition, the light emitting device may be configured to include at least one of a LED chip emitting violet, blue, green, red, and infrared light. In this case, the light emitting device 3 may adjust a color rendering index (CRI) from around '40' to '100', and may generate a variety of types of white light having a color temperature in a range of around 2,000K to around 20,000K. In addition, the light emitting device 3 may generate violet, blue, green, red, orange visible light or infrared light as required to adjust a color to be appropriate for an ambient atmosphere or based on a user's mood. In addition, light having a special wavelength capable of promoting plant growth may be generated. In another example, a white light may be suitable for reading, while a different color may be suitable for a dining room setting.

Figure 6:
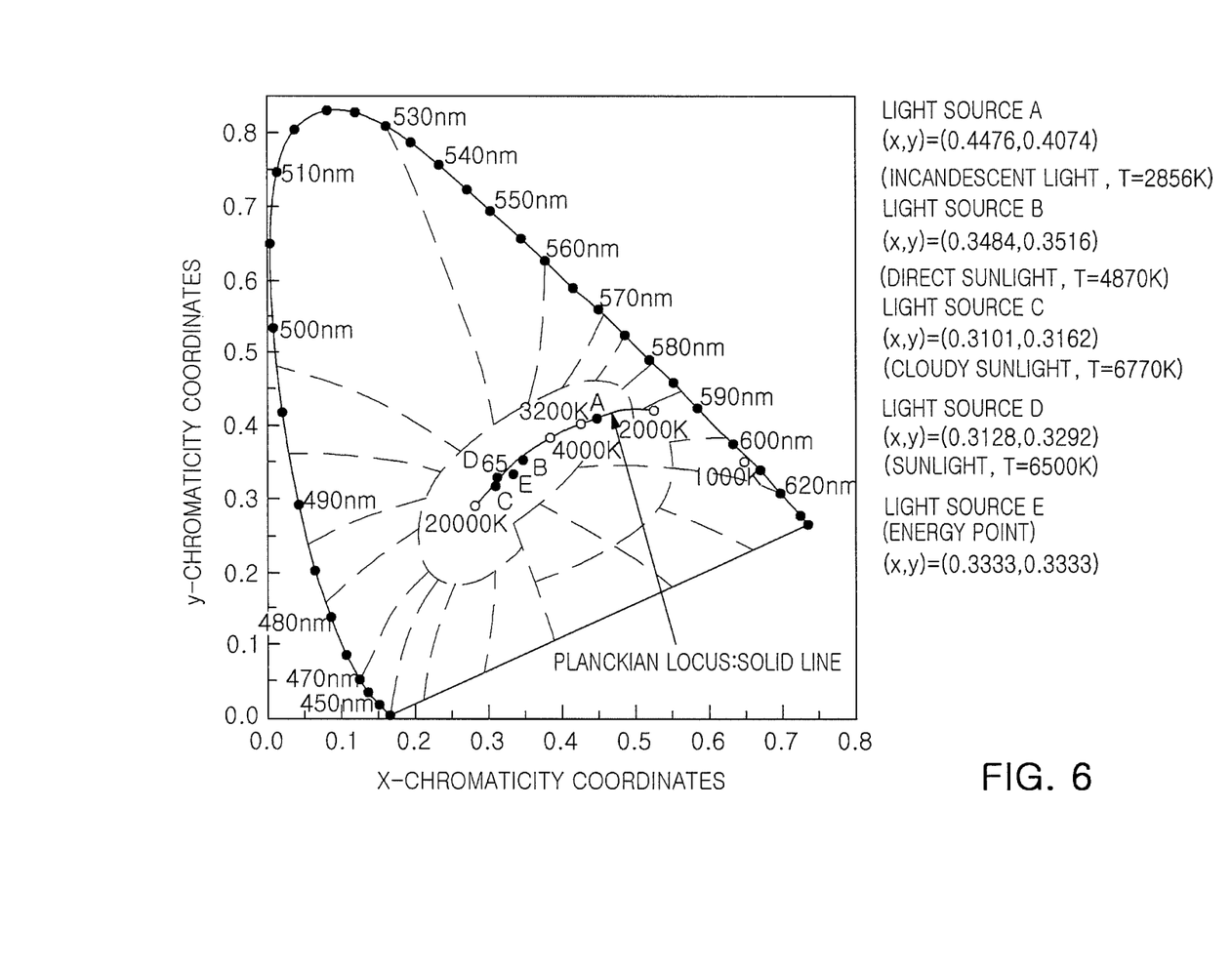
FIG. 6 is a CIE 1931 color space diagram (defined by the International Commission on Illumination) for describing a phosphor employable in an example embodiment.

White light obtained by combining a blue LED chip with yellow, green, red phosphors and/or green and red LED chips may have two or more peak wavelengths, and coordinates (x, y) thereof on the CIE 1931 chromaticity diagram illustrated in FIG. 6 may be located on line segments (0.4476, 0.4074), (0.3484, 0.3516), (0.3101, 0.3162), (0.3128, 0.3292), and (0.3333, 0.3333) connected to one another. Alternatively, the coordinates (x, y) may be located in a region surrounded by the line segments and a black body radiation spectrum. A color temperature of the white light may be within a range of around 2000K to around 20000K.

With reference to FIG. 6, white light in the vicinity of a point E (0.3333, 0.3333) below the blackbody radiation spectrum may be in a state in which light of a yellow-based component becomes relatively weak. This white light may be used as an illumination light source of a region in which a relatively bright or refreshing mood may be provided to the naked eye. Thus, a lighting device product using white light in the vicinity of the point E (0.3333, 0.3333) below the blackbody radiation spectrum may be effective for use in retail spaces in which groceries, clothing, or the like are for sale.

Phosphors may be represented by the following empirical formulae and have colors as follows:

Oxide-based Phosphors: Yellow and green $Y_3Al_5O_{12}$:Cerium (Ce), $Tb_3Al_5O_{12}$:Ce, $Lu_3Al_5O_{12}$:Ce Silicate-based Phosphors: Yellow and green $(Ba,Sr)_2SiO_4$: Europium (Eu), Yellow and yellowish-orange $(Ba,Sr)_3SiO_5$:Ce Nitride-based Phosphors: Green β-SiAlON:Eu, yellow $La_3Si_6N_{11}$:Ce, yellowish-orange α-SiAlON:Eu, red $CaAlSiN_3$:Eu, $Sr_2Si_5AlN_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ (0.5≤x≤3, 0<z<0.3, 0≤y≤4) (here, Ln is at least one material selected from a group consisting of a group IIIa element and a rare-earth element, and M is at least one material selected from a group consisting of Calcium (Ca), Barium (Ba), Strontium (Sr) and Magnesium (Mg))

Fluoride-based Phosphors: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$, $K_3SiF_7$:$Mn^{4+}$ A composition of phosphors should primarily coincide with stoichiometry. Respective elements may be substituted with other elements in respective groups of the periodic table of elements. For example, Sr may be substituted with Ba, Ca, or Mg, or a similar element of an alkaline earth group II. Y may be substituted with Lanthanum-based Terbium (Tb), Lutetium (Lu), Scandium (Sc), or Gadolinium (Gd). In addition, Eu, an activator, may be substituted with Ce, Tb, Praseodymium (Pr), Erbium (Er), or Ytterbium (Yb), according to a required level of energy, and an activator used alone or a sub-activator, for modification of characteristics thereof, may additionally be used.

In further detail, in the case of a fluoride-based red phosphor, to improve reliability thereof at high temperatures and high humidity, phosphors may be coated with fluoride not containing Mn or a phosphor surface or a fluoride-coated surface of phosphors, coated with a fluoride not containing Mn, may further be coated with an organic material. For the fluoride-based red phosphor as described above, a narrow full width at half maximum of 40 nm or less may be obtained, unlike for other phosphors. Thus, the fluoride-based red phosphors may be used in high-resolution TV sets such as UHD TVs.

In addition, as a phosphor substitute for the wavelength conversion material, a material such as a quantum dot (QD) may be used, and a mixture of a phosphor and a quantum dot, or a QD alone, may be used.

The QD may have a core-shell structure obtained using a group III-V compound semiconductor material or a group II-VI compound semiconductor material. For example, the quantum dot may have a core formed using Cadmium Selenide (CdSe), or Indium Phosphide (InP), and a shell formed using Zinc Sulfide (ZnS), or Zinc Selenide (ZnSe). Further, the QD may have a ligand for stabilization of the core and the shell. For example, the core may have a diameter of approximately 1 nm to 30 nm, and in one embodiment approximately 3 nm to 10 nm. The shell may have a thickness of approximately 0.1 nm to approximately 20 nm, and in one embodiment 0.5 nm to 2 nm.

The quantum dot may implement various colors of light depending on a size thereof. Specifically when the quantum dot is used as a phosphor substitute, the quantum dot may be used as a red or green phosphor. When using the quantum dot, a narrow full width at half maximum of, for example, about 35 nm, may be obtained.

Figure 7:
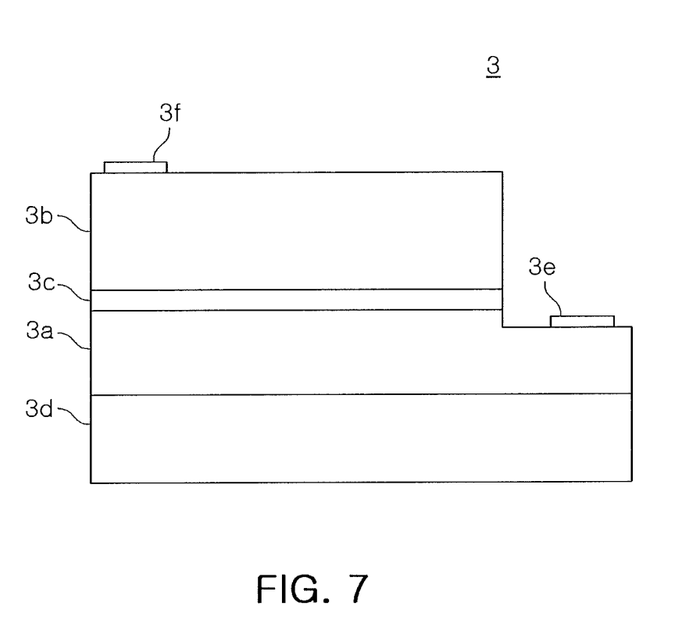
FIG. 7 is a cross-sectional elevation view of a light emitting device employable in an example embodiment.

FIG. 7 is a cross-sectional view of a light emitting device employable in an example embodiment. The light emitting device 3 may have a structure in which a first conductivity type semiconductor layer 3a, a second conductivity type semiconductor layer 3b, and an active layer 3c disposed therebetween. The first conductivity type semiconductor layer 3a located on a growth substrate 3d having optical transmissivity, may include a semiconductor doped with an n-type impurity, and may include an n-type nitride semiconductor layer. The second conductivity type semiconductor layer 3b may include a semiconductor doped with a p-type impurity, and may include a p-type nitride semiconductor layer. In another embodiment, the positions of the first and second conductivity type semiconductor layers 3a and 3b may be interchanged.

The first and second conductivity type semiconductor layers 3a and 3b may be formed using a material represented by an empirical formula $Al_xIn_yGa_{(1-x-y)}N$ (where $0 \leq x < 1$, $0 \leq y < 1$, $0 \leq x+y < 1$), including for example, a material such as Gallium Nitride (GaN), Aluminum Gallium Nitride (AlGaN), Indium Gallium Nitride (InGaN), or Aluminum Indium Gallium Nitride (AlInGaN).

The active layer 3c disposed between the first and second conductivity type semiconductor layers 3a and 3b may emit light having a predetermined level of energy by a recombination of electrons and holes. The active layer 3c may include a material having an energy band gap smaller than an energy band gap of the first and second conductivity type semiconductor layers 3a and 3b. For example, when the first and second conductivity type semiconductor layers 3a and 3b are configured as a GaN-based compound semiconductor, the active layer 3c may include an InGaN-based compound semiconductor having an energy band gap smaller than an energy band gap of GaN.

In addition, the active layer 3c may have a multiple quantum well (MQW) structure in which a quantum well layer and a quantum barrier layer are alternately layered, (e.g., an InGaN/GaN structure). However, the active layer 3c is not limited thereto, and the active layer 3c may have a single quantum well (SQW) structure.

A first electrode pad 3e may be disposed on an exposed surface of the first conductivity type semiconductor layer 3a from which the second conductivity type semiconductor layer 3b, the active layer 3c, and portions of the first conductivity type semiconductor layer 3a have been etched and exposed, and whereby the first electrode pad 3e may be connected to the first conductivity type semiconductor layer 3a. A second electrode pad 3f may be disposed in an upper surface of the second conductivity type semiconductor layer 3b, whereby the second electrode pad 3f may be connected to the second conductivity type semiconductor layer 3b. The first and second electrode pads 3e and 3f may be connected to the first and second lead frames 5a and 5b, respectively.

Figure 8:
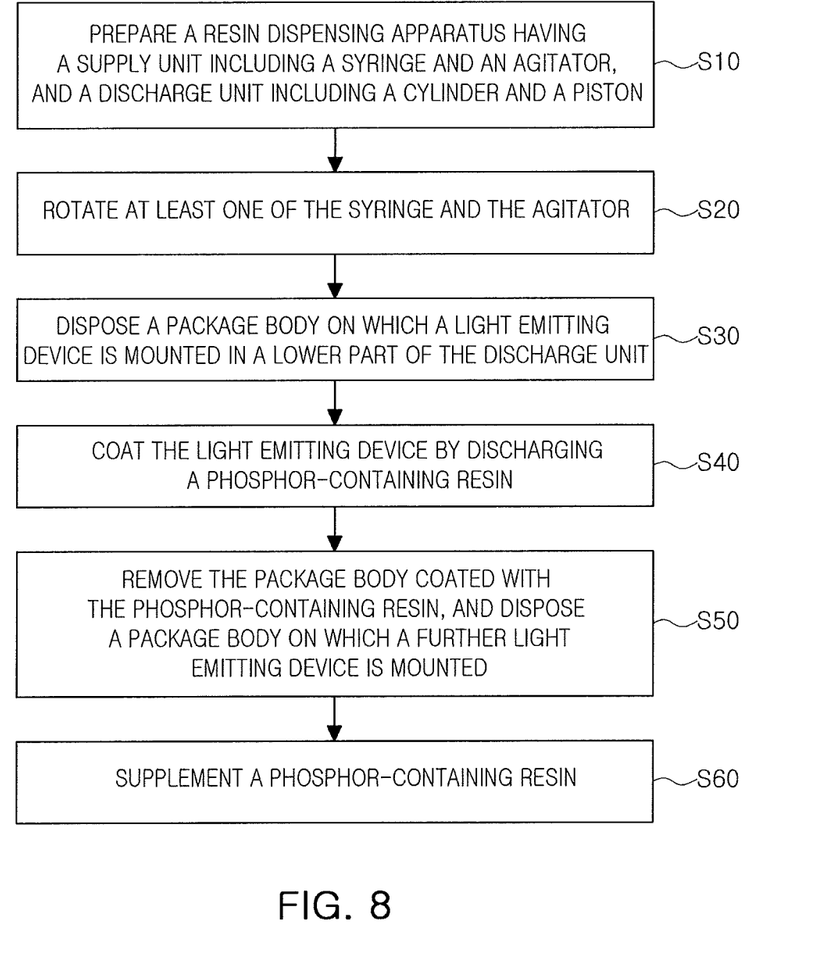
FIG. 8 is a flow chart view of a method for manufacturing a light emitting device package according to an example embodiment.

A method of manufacturing a light emitting device package according to an example embodiment of the present inventive concept is described with reference to FIG. 8. First, resin dispensing apparatuses 10 (or 20) including a supply unit 100 including a syringe 110 having an internal space 111, and an agitator 120 disposed in the internal space, and a discharge unit 200 including a cylinder 210 connected to the syringe 110 through a connecting pipe 400 and having a discharge nozzle 212, and a piston 220 disposed inside the cylinder 210 are prepared (see step S10).

The resin dispensing apparatuses 10 (or 20) may have a structure in which at least one of the syringe 110 and the agitator 120 is rotated. In an example embodiment, the resin dispensing apparatus may have a configuration and a structure substantially similar to the resin dispensing apparatus 10 according to an example embodiment illustrated in FIG. 1 or the resin dispensing apparatus 20 illustrated in FIG. 4.

A detailed description with respect to respective components of the resin dispensing apparatuses 10 (or 20) may be understood with reference to the above descried example embodiments (see FIG. 1 or FIG. 4). Therefore, specific descriptions thereof will be omitted.

A plurality of package bodies 2 where a light emitting device 3 is mounted are prepared as a dispensing object. In addition, a light emitting device package 1 may be manufactured by dispensing phosphor-containing resin R to the light emitting device 3 through the resin dispensing apparatuses 10 (or 20). The light emitting device package 1 manufactured according to the example embodiment may be understood with reference to the above described example embodiment (see FIG. 5A).

Next, the internal space is filled with the phosphor-containing resin R, and at least one of the syringe 110 and the agitator 120 is rotated (S20).

As illustrated in FIG. 1, when the syringe 110 is connected to a driving unit 130, the syringe 110 may be rotated. As illustrated in FIG. 4, when the agitator 120 is connected to the driving unit 130, the agitator 120 may be rotated.

As well, although not illustrated in a drawing, the syringe 110 and the agitator 120 may be connected to the driving unit 130, by which the syringe 110 and the agitator 120 may both be rotated. In one embodiment, the syringe 110 and the agitator 120 rotate in opposite directions to increase the agitation of the resin R in the syringe 110.

As described above, at least one of the syringe 110 and the agitator 120 is rotated to continuously stir and mix the phosphor-containing resin R, thereby preventing phosphor settling from occurring in the phosphor-containing resin R.

Next, a package body 2 in which the light emitting device 3 is mounted is disposed below the discharge unit 200 (S30). The discharge unit 200 may be disposed directly above the package body 2, which is a dispensing object. For example, the discharge unit 200 is colinear with a central axis of the package body 2, and a discharge nozzle 212 of the cylinder 210 may be disposed in a structure opposing the light emitting device 3.

The plurality of package bodies 2, for example, may be located on a moving unit such as a conveyor belt and then arranged, and sequentially moved and disposed in a lower part of the discharge unit 200.

Next, the phosphor-containing resin R supplied to an inside of the cylinder 210 through the connecting pipe 400 is pressed through the piston 220, and a fixed amount of the phosphor-containing resin R is discharged through the discharge nozzle 212, by which the light emitting device 3 is dispensed therewith (S40). The light emitting device 3 mounted in the package body 2 may be encapsulated by the phosphor-containing resin R.

Next, the package body 2 coated with the phosphor-containing resin R is removed, and then other package body 2 in which a light emitting device 3 is mounted is disposed below the discharge unit 200 (S50). In one example, the package body 2 in which the light emitting device 3 is dispensed with the phosphor-containing resin R is removed from the resin dispensing apparatus, and may be moved to perform subsequent processes for curing the phosphor-containing resin R.

As the phosphor-containing resin R is supplied from the syringe 110 of the supply unit 100 to the cylinder 210 of the discharge unit 200, supplementary amounts of the phosphor-containing resin R may be supplied to the internal space of the syringe 110 (S60).

As described above, the syringe 110 is not replaced but the supplementary amounts of the phosphor-containing resin R are periodically supplied to the internal space of the syringe 110 (S60) to solve an otherwise time consuming step of stopping an entire manufacturing process for replacing a syringe 110.

Figure 9:
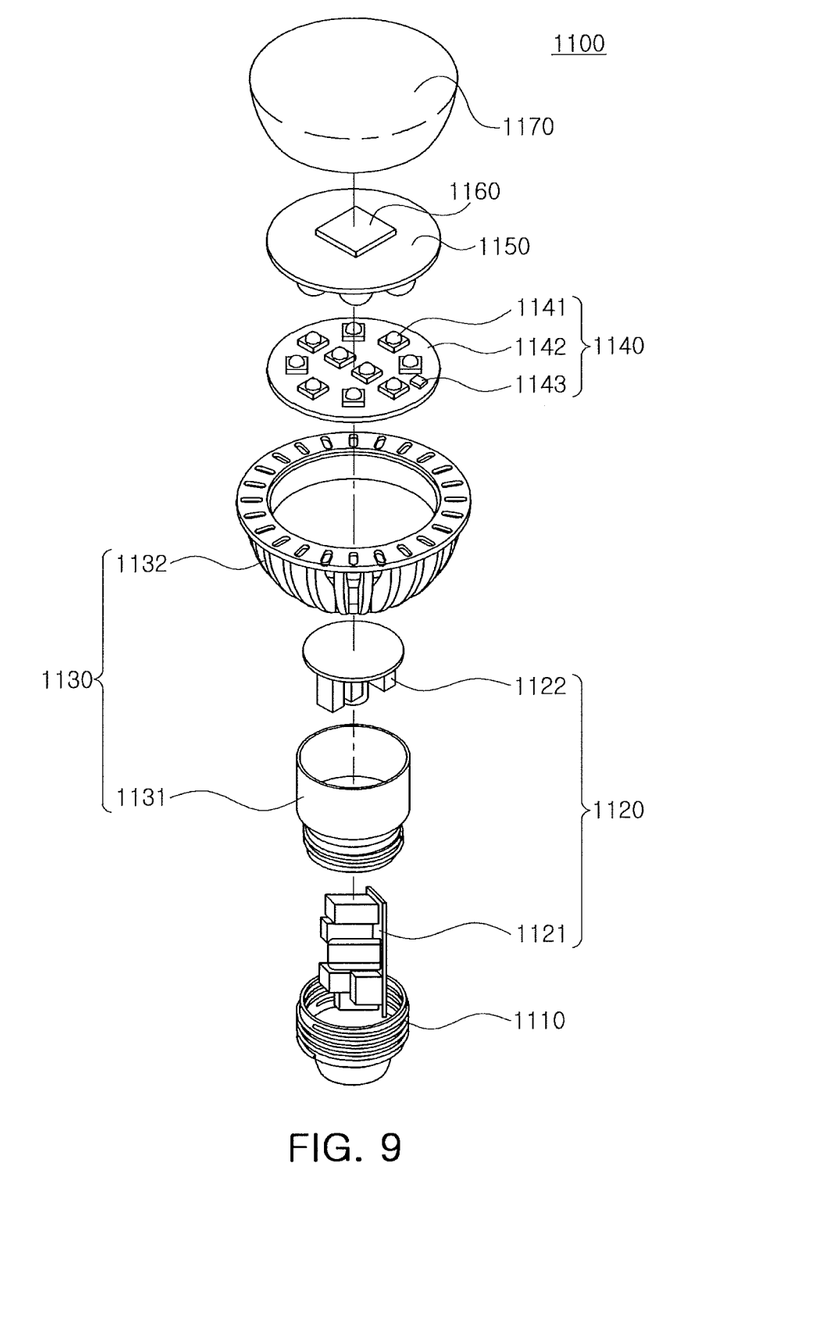
FIG. 9 is an exploded perspective view of a lighting apparatus (e.g., a bulb-type lighting apparatus) according to an example embodiment of the present inventive concept.
Figure 10:
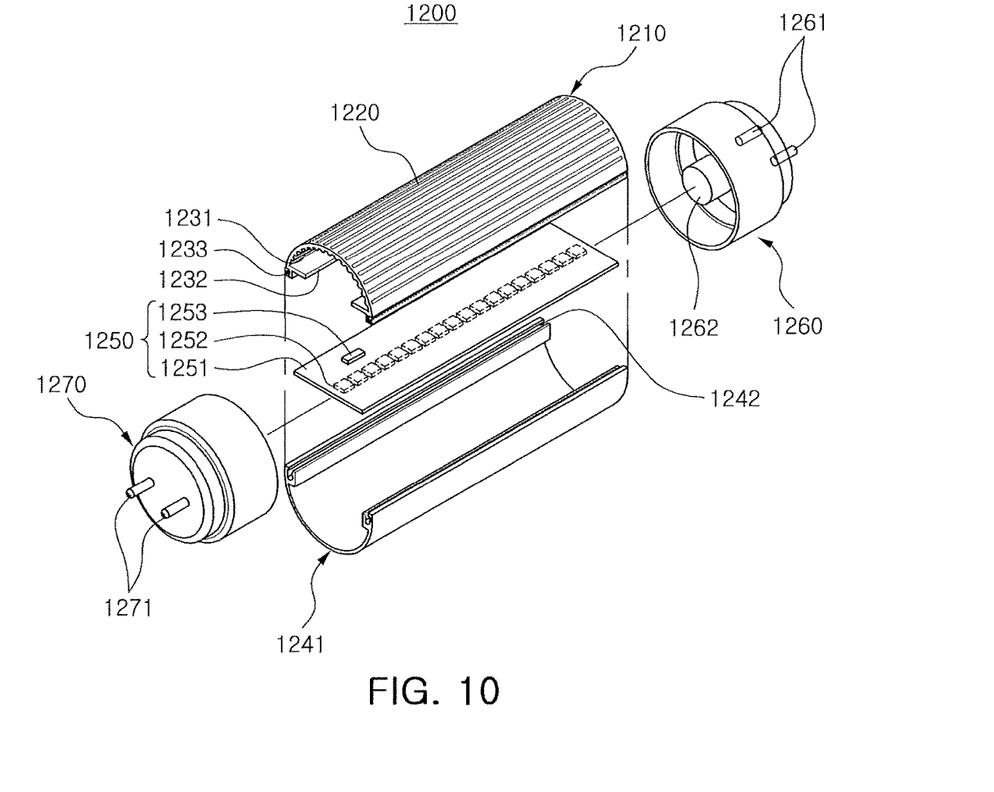
FIG. 10 is an exploded perspective view of a lighting apparatus (e.g., an L-type lamp) according to an example embodiment of the present inventive concept.

FIG. 9 and FIG. 10 illustrate various lighting apparatuses employing a light emitting device package according to an example embodiment of the present inventive concept. With reference to FIG. 9, a lighting apparatus 1100 may include a socket 1110, a power supply unit 1120, a heat radiating unit 1130, a light source unit 1140, and an optical unit 1170. According to an example embodiment of the present inventive concept, the light source unit 1140 may include a substrate 1142, a plurality of light emitting device packages 1141 mounted on the substrate 1142, and a controller 1143. The controller 1143 may store driving information of the plurality of light emitting device packages 1141 therein.

The lighting apparatus 1100 may include a reflecting plate 1150 disposed above the light source unit 1140. The reflecting plate 1150 allows light from the light source unit 1140 to be uniformly dispersed toward a lateral surface and a rear, whereby glare may be reduced.

A communications module 1160 may be mounted on an upper part of the reflecting plate 1150, and home-network communications may be implemented through the communications module 1160. For example, the communications module 1160 may be a wireless communications module using Zigbee®, Wi-Fi, or Li-Fi, and may control illumination of a lighting apparatus installed indoors and outdoors, such as on/off operations, or brightness adjustment, through a smartphone or a wireless controller. In addition, electronic product systems located indoors or outdoors, such as a TV, a refrigerator, an air conditioner, or a door lock, as well as a vehicle, may be controlled by using a Li-Fi communications module using light having a visible wavelength of a lighting apparatus installed indoors and outdoors. The reflecting plate 1150 and the communications module 1160 may be covered by an optical unit 1170.

The socket 1110 may be configured to replace an existing lighting apparatus. Electrical power supplied to the lighting apparatus 1100 may be applied through the socket 1110. As illustrated, the power supply unit 1120 may include a first power supply unit 1121 and a second power supply unit 1122 physically separated from but electrically coupled to each other.

The heat radiating unit 1130 may include an internal heat radiating unit 1131 and an external heat radiating unit 1132. The internal heat radiating unit 1131 may be directly connected to the light source unit 1140 and/or the power supply unit 1120, by which heat may be transferred to the external heat radiating unit 1132.

The optical unit 1170 may include an internal optical portion (not shown) and an external optical portion (not shown) and may be configured such that light emitted from the light source unit 1140 may be uniformly dispersed.

A plurality of light emitting device packages 1141 of the light source unit 1140 may receive electrical power from the power supply unit 1120 and may emit light to the optical unit 1170. In the example embodiment, the light emitting device packages 1141 may have a structure substantially corresponding to the light emitting device packages 1 and 1' of FIG. 5A and FIG. 5B. Thus, detailed descriptions with respect to each constituent element of the light emitting device packages 1141 may be understood with reference to the above described example embodiment.

FIG. 10 is an exploded perspective view of a bar type (e.g., L-type) lamp as a lighting apparatus according to example embodiments. With reference to FIG. 10, a lighting apparatus 1200 may include a heat radiating member 1210, a cover 1241, a light source module 1250, a first socket 1260, and a second socket 1270. A plurality of heat radiating fins 1220 and 1231 having a concave-convex form may be formed on an inner surface or/and an external surface of the heat radiating member 1210, and the heat radiating fins 1220 and 1231 may be designed to have various forms and intervals therebetween.

A support portion 1232 having a protruding form may be formed inwardly of the heat radiating member 1210. The light source module 1250 may be fixed to the support portion 1232. A stop protrusion 1233 may be formed on two ends of the heat radiating member 1210.

The cover 1241 may include a stop groove 1242 formed therein, and the stop groove 1242 may be coupled to the stop protrusion 1233 of the heat radiating member 1210 in a hook coupling structure. Positions in which the stop groove 1242 and the stop protrusion 1233 are formed may be interchanged.

The light source module 1250 may include a light emitting device package array. The light source module 1250 may include a printed circuit board 1251, light emitting device packages 1252, and a controller 1253. As illustrated above, the controller 1253 may store driving information of the light emitting device packages 1252 therein. The printed circuit board 1251 may be provided with circuit wirings formed therein, for operating the light emitting device packages 1252. In addition, constituent elements operating the light emitting device packages 1252 may be included in the light source module 1250. According to an example embodiment, the light emitting device package 1252 may be substantially identical to the light emitting device packages 1 and 1' of FIG. 5A and FIG. 5B. Thus, detailed descriptions thereof will be omitted.

The first and second sockets 1260 and 1270 may be provided as a pair of sockets and may have a structure in which they are coupled to two ends of a cylindrical cover unit configured of the heat radiating member 1210 and the cover 1241. For example, the first socket 1260 may include electrode terminals 1261 and a power supply device 1262. The second socket 1270 may include dummy terminals 1271 disposed thereon. In addition, an optical sensor and/or a communications module (not shown) may be embedded inside one of the first socket 1260 or the second socket 1270. For example, the optical sensor and/or the communications module may be installed within the second socket 1270 in which the dummy terminals 1271 are disposed. In another example, an optical sensor and/or a communications module may be installed within the first socket 1260 in which the electrode terminals 1261 are disposed.

A lighting apparatus using a light emitting device may be broadly classified as either an indoor LED lighting device and an outdoor LED lighting device in accordance with a purpose thereof. The indoor LED lighting device may mainly be used in a bulb-type lamp, an LED-tube lamp, or a flat-type lighting apparatus, as an existing lighting device retrofit. The outdoor LED lighting device may be used in a streetlight, a safety lighting fixture, a floodlight, a landscape lamp, or a traffic light but is not limited thereto.

In addition, a lighting apparatus using LEDs may be utilized as an internal or an external light sources in vehicles. As an internal light source, the lighting apparatus using LEDs may be used as an interior light of a motor vehicle, a reading lamp, or various types of light source for an instrument panel. As an external light source of a motor vehicle, a lighting device using LEDs may be used in all types of light sources such as headlights, brake lights, turn signal lights, fog lights, or running lights.

Furthermore, light sources as described herein may be used in robots or in various kinds of mechanical equipment, or LED lighting apparatuses. Specifically, an LED lighting device using light within a special wavelength band may promote plant growth, may stabilize people's moods, or may be used therapeutically (e.g., for emotional lighting).

As set forth above, according to example embodiments of the present inventive concept, a resin dispensing apparatus capable of preventing phosphor settling from occurring inside a phosphor-containing resin with which a syringe is filled is disclosed.

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents.

What is claimed is:

1. A resin dispensing apparatus comprising:
a supply unit including a syringe having an internal space configured to hold a phosphor-containing resin, an agitator disposed in the internal space, the supply unit configured to rotate the syringe to prevent settling of phosphor contained in the phosphor-containing resin; and
a discharge unit including a cylinder having a discharge nozzle through which the phosphor-containing resin, received through a connecting pipe connected to the syringe, is discharged, and a piston providing pressure to discharge the phosphor-containing resin inside the cylinder through the discharge nozzle.

2. The apparatus of claim 1, wherein the discharge unit is above a dispensing object, and the supply unit is inclined.

3. The apparatus of claim 1, wherein the syringe is fastened to the connecting pipe by a hinge.

4. The apparatus of claim 1, wherein the agitator comprises a shaft extended in a longitudinal direction of the syringe, and a blade protrudes from an outer circumferential surface of the shaft in the internal space.

5. The apparatus of claim 4, wherein the blade has a spiral screw structure surrounding the outer circumferential surface of the shaft.

6. The apparatus of claim 1, further comprising a driving unit connected to the syringe.

7. The apparatus of claim 1, further comprising a frame fastened to the supply unit to support the supply unit.

8. The apparatus of claim 7, wherein the frame is configured to adjust a position of the supply unit.

9. The apparatus of claim 1, further comprising a control unit configured to control operations of the supply unit and the discharge unit.

10. The apparatus of claim 1, wherein the phosphor-containing resin includes one of a silicone resin and an epoxy resin, and includes at least one type of phosphor.

11. A resin dispensing apparatus comprising:
a supply unit including a syringe having an internal space configured to hold a phosphor-containing resin, an agitator disposed in the internal space, the supply unit configured to rotate the agitator to prevent settling of phosphor contained in the phosphor-containing resin; and
a discharge unit including a cylinder having a discharge nozzle through which the phosphor-containing resin, received through a connecting pipe connected to the syringe, is discharged, and a piston providing pressure to discharge the phosphor-containing resin inside the cylinder through the discharge nozzle.

12. The resin dispensing apparatus of claim 11, further comprising a driving unit connected to the agitator.

13. The resin dispensing apparatus of claim 11, wherein the discharge unit is above a dispensing object, and the supply unit is inclined.

14. The resin dispensing apparatus of claim 11, wherein the agitator comprises a shaft extended in a longitudinal direction of the syringe, and a blade protrudes from an outer circumferential surface of the shaft in the internal space.

15. The resin dispensing apparatus of claim 11, further comprising a frame fastened to the supply unit and supporting the supply unit.

16. A resin dispensing apparatus comprising:
a supply unit including a syringe configured to hold a phosphor-containing resin, an agitator inside the syringe disposed on a collinear axis of the syringe, the syringe inclined at an angle to a surface having a dispensing object thereon;
a discharge unit coupled to the supply unit by a connecting pipe configured to transport the phosphor-containing resin from the syringe to the discharge unit, the discharge unit having a piston configured to transfer the phosphor-containing resin from the discharge unit to the dispensing object; and
a controller configured to rotate at least one of the syringe and the agitator, and to move the piston to transfer the discharged resin to the dispensing object.

17. The apparatus of claim 16 wherein the phosphor-containing resin includes one of a silicone material and an epoxy material.

18. The apparatus of claim 16 wherein the controller rotates the syringe by controlling a motor coupled to the syringe.

19. The apparatus of claim 16 wherein the controller rotates the agitator by controlling a motor coupled to the agitator.

20. The apparatus of claim 16 wherein the controller rotates the syringe and the agitator by controlling a motor coupled to the syringe to rotate the syringe in a rotating direction, and the motor coupled to the agitator to rotate the agitator in a counter-rotating direction.

* * * * *